(12) United States Patent
Liao et al.

(10) Patent No.: US 10,889,741 B2
(45) Date of Patent: Jan. 12, 2021

(54) FLUOROCARBON RESIN COMPOSITION AND PREPREG AND COPPER FOIL SUBSTRATE USING THE SAME

(71) Applicant: NAN YA PLASTICS CORPORATION, Taipei (TW)

(72) Inventors: Te-Chao Liao, Taipei (TW); Hao-Sheng Chen, Taipei (TW); Chih-Kai Chang, Taipei (TW); Hung-Yi Chang, Taipei (TW)

(73) Assignee: NAN YA PLASTICS CORPORATION, Taipei (TW)

( * ) Notice: Subject to any disclaimer, the term of this patent is extended or adjusted under 35 U.S.C. 154(b) by 0 days.

(21) Appl. No.: 16/202,173

(22) Filed: Nov. 28, 2018

(65) Prior Publication Data

US 2020/0165501 A1    May 28, 2020

(51) Int. Cl.

| | |
|---|---|
| *B32B 15/08* | (2006.01) |
| *B32B 15/14* | (2006.01) |
| *B32B 15/20* | (2006.01) |
| *C08L 27/18* | (2006.01) |
| *H05K 1/03* | (2006.01) |
| *C09K 5/14* | (2006.01) |
| *C08J 5/24* | (2006.01) |
| *H05K 1/02* | (2006.01) |
| *H05K 3/02* | (2006.01) |
| *B32B 15/082* | (2006.01) |

(52) U.S. Cl.
CPC ............... *C09K 5/14* (2013.01); *B32B 15/08* (2013.01); *B32B 15/082* (2013.01); *B32B 15/20* (2013.01); *C08J 5/24* (2013.01); *C08L 27/18* (2013.01); *H05K 1/024* (2013.01); *H05K 1/0373* (2013.01); *H05K 3/022* (2013.01); *B32B 2260/021* (2013.01); *B32B 2260/046* (2013.01); *B32B 2262/101* (2013.01); *B32B 2457/08* (2013.01); *C08J 2327/18* (2013.01); *C08J 2427/18* (2013.01); *C08J 2427/20* (2013.01); *C08J 2429/10* (2013.01); *C08L 2203/20* (2013.01); *C08L 2205/025* (2013.01); *C08L 2205/035* (2013.01); *C08L 2205/14* (2013.01); *H05K 2201/015* (2013.01); *H05K 2201/0209* (2013.01); *H05K 2201/0257* (2013.01)

(58) Field of Classification Search
CPC .... H05K 1/0366; H05K 1/0373; H05K 1/038; H05K 1/03–1/056; B32B 15/08–15/085; B32B 15/20; B32B 2457/08
See application file for complete search history.

(56) References Cited

U.S. PATENT DOCUMENTS

| | | | |
|---|---|---|---|
| 2005/0153610 A1* | 7/2005 | McCarthy | ............ C09D 127/12 442/59 |
| 2010/0080959 A1* | 4/2010 | Harvey | .................... C08L 27/18 428/172 |

FOREIGN PATENT DOCUMENTS

| | | |
|---|---|---|
| CN | 102216383 A | 10/2011 |
| JP | 2001328205 A | 11/2001 |

* cited by examiner

*Primary Examiner* — Ramsey Zacharia
(74) *Attorney, Agent, or Firm* — Li & Cai Intellectual Property (USA) Office

(57) ABSTRACT

A fluorocarbon resin composition is applicable to produce high-frequency circuit boards including a polytetrafluoroethylene resin; a fluorine-containing copolymer such as poly fluoroalkoxy and fluorinated ethylene propylene; low molecular-weight PTFE micro-powders and inorganic powders; in particular the temperature of pressing copper foil substrates is lowered from 350° C. to 250° C. via a lowering temperature rate of 1 to 4° C./min to improve the crystallinity of the fluorocarbon resin composition as well as improve the copper foil substrate with a high thermal conductivity and a wide range of dielectric constant.

1 Claim, No Drawings

FLUOROCARBON RESIN COMPOSITION AND PREPREG AND COPPER FOIL SUBSTRATE USING THE SAME

BACKGROUND OF THE PRESENT INVENTION

1. Field of the Invention

The present invention generally relates to a fluorocarbon resin composition and more particularly, to a fluorocarbon resin composition containing inorganic powders and low molecular-weight of polytetrafluoroethylene (PTFE) micropowders. The fluorocarbon resin composition having excellent dielectric properties and heat conductivity is so suitable for use in manufacturing prepregs and copper foil substrates for high-frequency circuit boards.

2. Description of Related Art

With the rapid development of wireless networks, satellite radars and 5G communication and the use of the architectures of intelligent connectivity, elastic RAN and massive MIMO, 5G has brought new types of electronic communication services and smart driving services to consumers. However, the power output of 5G electronic products continues to increase and the related frequency is significantly increased to the millimeter wave frequency band (from 30 to 300 GHz). Correspondingly, the requirement for heat dissipation of materials is also greatly increased. Under such conditions, the dielectric properties of the conventional FR4 substrate are unable to meet the demanding requirements for high-frequency transmission, especially in view of signal attenuation characteristics at high frequencies.

In order to enhance heat dissipation of electronic components, according to the prior art teachings, the heat dissipation characteristics of electronic components are mostly improved in terms of materials and processes. For example, U.S. Pat. No. 9,508,648B2 teaches the preparation of a large amount of highly thermally conductive inorganic filler accounting for 90 wt % of a resin, such that the obtained laminated semiconductor substrate has characteristics such as high heat dissipation and low thermal expansion. However, the result of adding a large amount of inorganic filler to the laminated semiconductor substrate is liable to cause poor adhesion between the laminates, and copper is likely to fall off during drilling. In addition, voids are likely to occur in the material, which causes a problem of processing reliability.

For example, U.S. Pat. No. 5,975,201 teaches the use of a high thermal conductivity material and a low thermal conductivity material in a circuit board, and directs heat flow to the heat sink by a high thermal conductivity material for efficient heat distribution to overcome the problem of heat accumulation under the operation of high-power electronic components.

In addition to improving thermal conductivity from the choice of materials for a printed circuit board, heat dissipation characteristics can also be enhanced by the structural design of the printed circuit board. For example, copper blocks are buried in the printed circuit board, and high thermal conductivity characteristics of the copper blocks can be used to improve heat dissipation of high-power electronic components.

Furthermore, in the high-frequency microwave substrate of the prior art, common insulating resin materials used for the substrate include insulating resin materials such as hydrocarbon compounds, polyphenylene ether, cyanate ester and PTFE. These insulating resins have a large number of symmetrical structures, so the dipole moment between molecules is relatively small, which enhances the insulating characteristics of the high-frequency microwave substrate at high frequencies.

Among them, the insulating resins such as hydrocarbon compounds, polyphenylene ether and cyanate ester are often thermally cured by the modification of functional groups. Therefore, the type and amount of the functional groups significantly affect the dielectric properties. When it is necessary to achieve a plurality of characteristics such as mechanical and chemical resistance, these resins have to partially sacrifice their excellent dielectric characteristics.

In contrast, the polytetrafluoroethylene (PTFE) resin is a thermoplastic resin, where the hydrogen atoms around the carbon atoms of the main chain are replaced by fluorine atoms having the highest electronegativity. The PTFE resin has extremely high crystallinity and symmetry, and the molecular weight is usually as high as 1,000,000 to 5,000,000. Therefore, PTFE has excellent chemical inertness, thermal stability (the long-term use temperature is from −50° C. to 260° C.) and dielectric properties (i.e., low dielectric constant and low dielectric loss). Therefore, PTFE has been widely used in the microwave communication industry.

Although the PTFE resin has excellent physical properties, the extremely high molecular weight results in an extremely high viscosity (about 1010 to 1012) at the melting point, which makes it uneasy to flow and impossible to be molded by a conventional thermoplastic plastic processing method. In addition, the melting point of the PTFE resin is as high as 327° C., which makes the processing environment of PTFE more stringent. Conventional processing machinery and power equipment for thermoplastic plastic processing are not qualified for PTFE.

In order to overcome the problem that PTFE is difficult to process, the prior art techniques perfluoro or non-perfluoro meltable fluorocarbon resins such as poly fluoroalkoxy (PFA), fluorinated ethylene propylene (FEP), ethylene tetrafluoroethylene (ETFE), ethylene chlorotrifluoroethylene (ECTFE), polyvinyl fluoride (PVF), polyvinylidene fluoride (PVDF), etc.

Perfluoro resins (PFA, FEP) maintain excellent dielectric properties with lower processing temperatures, but they are more expensive, which limits the popularity of their applications. Non-perfluoro resins (ETFE, ECTFE, PVF, PVDF, etc.) exhibit lower processing temperatures and superior mechanical properties, but they have a lower temperature for long-term use such that the thermal stability, chemical resistance and dielectric properties are significantly poorer than they are required.

PTFE is a highly crystalline polymer. The raw material (without any thermal processing after synthesis) has crystallinity as high as 92 to 98%. However, after processing, sintering and cooling, the crystallinity is significantly reduced to less than 70%. The thermal conductivity is about 0.25 W/m·K, which cannot be effectively applied to high-power electronic components. To solve this problem, the prior art teaches that by adding a large amount of highly thermally conductive inorganic ceramic powders, the thermal conductivity can be effectively increased to a level of about 1.5 W/m·K. However, the addition of a large amount of highly thermally conductive inorganic ceramic powders easily affects the processability and reliability of the high-frequency substrate or the sheet material, such that the excellent physical and dielectric properties of PTFE are weakened.

SUMMARY OF THE INVENTION

In view of the above, the present invention provides a fluorocarbon resin composition with excellent dielectric properties and heat conductivity, which is suitable for use in the manufacture of prepregs and copper foil substrates for high-frequency circuit boards. More particularly, during the process of pressing the copper foil substrate, when the temperature is lowered from 350° C. to 250° C., the crystallinity of the fluorocarbon resin composition can be improved by controlling the pressing rate appropriately to lower the temperature by 1 to 4° C./min to improve the copper foil substrate with a high thermal conductivity and a wide range of dielectric constant for use in the manufacture of high-frequency circuit substrates.

The fluorocarbon resin composition contains, on the basis of the total weight of the fluorocarbon resin composition being 100 wt %, the following components:
(1) a polytetrafluoroethylene (PTFE) resin, accounting for 10 to 90 wt %;
(2) a fluorine-containing copolymer, accounting for 1 to 10 wt % and selected from the group consisting of one or a combination of more of poly fluoroalkoxy (PFA) and fluorinated ethylene propylene (FEP);
(3) low molecular-weight PTFE micro-powders, accounting for 5 to 50 wt % and prepared by thermal cracking degradation or irradiation degradation, the molecular weight of PTFE being 2000 to 200000; and
(4) inorganic powders, accounting for 1 to 80 wt %.

The beneficial effects of the fluorocarbon resin composition of the present invention include:
1. The thermal conductivity of the fluorocarbon resin composition is enhanced by introducing low molecular-weight PTFE micro-powders such that the amount of each component in the fluorocarbon resin composition can be more diversified to control the dielectric properties of the fluorocarbon resin composition more easily; and
2. The copper foil substrate manufactured by using the fluorocarbon resin composition exhibits a high thermal conductivity and a wide range of dielectric constant, and it is suitable for making a high-frequency circuit substrate, which overcomes the problem that the conventional high heat-conducting high-frequency microwave substrate fails to provide a high thermal conductivity, excellent dielectric properties and high processing reliability.

DETAILED DESCRIPTION OF THE PREFERRED EMBODIMENTS

The fluorocarbon resin composition of the present invention contains inorganic powders and low molecular-weight PTFE micro-powders with excellent dielectric properties and high heat conductivity characteristics, which is suitable for use in the manufacture of prepregs and copper foil substrates for high-frequency circuit boards.

The fluorocarbon resin composition contains, on the basis of the total weight of the fluorocarbon resin composition being 100 wt %, the following components:
(1) a polytetrafluoroethylene (PTFE) resin, accounting for 10 to 90 wt %;
(2) a fluorine-containing copolymer, accounting for 1 to 10 wt %;
(3) low molecular-weight PTFE micro-powders, accounting for 5 to 50 wt %; and
(4) inorganic powders, accounting for 1 to 80 wt %.

The fluorine-containing copolymer is selected from one or a combination of more of poly fluoroalkoxy (PFA) and fluorinated ethylene propylene (FEP). If the content of the fluorine-containing copolymer of the fluorocarbon resin composition of the present invention is more than 10 wt %, glue flow is likely to occur during the process of pressing the copper foil substrate, which affects the processability and thickness uniformity of the copper foil substrate. If the content of the fluorine-containing copolymer is less than 1%, voids are likely to occur in the copper foil substrate.

The structure of the polytetrafluoroethylene (PTFE) resin is as shown in Structural Formula (A):

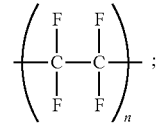

Structural Formula (A)

where n is an integer and n≥1.

The structure of poly fluoroalkoxy (PFA) is as shown in Structural Formula (B):

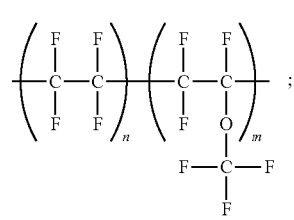

Structural Formula (B)

where n and m are integers, and n≥1 and m≥1.

The structure of fluorinated ethylene propylene (FEP) is as shown in Structural Formula (C):

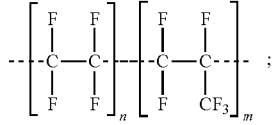

Structural Formula (C)

where n and m are integers, and n≥1 and m≥1.

The low molecular-weight PTFE micro-powders can be obtained by thermal cracking degradation or irradiation degradation, preferably by irradiation degradation with high energy utilization efficiency. The molecular weight of the low molecular-weight PTFE micro-powders is as high as 2,000 to 200,000, preferably 10,000 to 100,000, and the average particle diameter is 1 to 10 μm.

If the content of the inorganic powders account for more than 80 wt % of the fluorocarbon resin composition, the adhesion between the sheets of the copper foil substrate and the adhesion between the sheet and the copper foil are affected, which tends to cause delamination of the copper foil substrate.

The average particle diameter of the inorganic powders is 0.01 to 50 micrometers and the inorganic powders may be selected from the group consisting of one or a combination of more of spherical or irregular silicon dioxide ($SiO_2$), titanium dioxide ($TiO_2$), aluminum hydroxide ($Al(OH)_3$), spherical or irregular alumina ($Al_2O_3$), magnesium hydroxide ($Mg(OH)_2$), magnesium oxide (MgO), calcium carbonate ($CaCO_3$), boron oxide ($B_2O_3$), calcium oxide (CaO), strontium titanate ($SrTiO_3$), barium titanate ($BaTiO_3$), calcium titanate ($CaTiO_3$), magnesium titanate ($2MgO.TiO_2$), spherical or agglomerated or flaky boron nitride (BN), aluminum nitride (AlN), silicon carbide (SiC), cerium oxide ($CeO_2$), fume silica, etc. Among them, fume silica may also be selected from the group consisting of porous nano-sized vermiculite particle having an average particle diameter of 1 to 100 nanometers (nm). $SiO_2$ may be a molten type and a crystalline type. Considering the dielectric properties, $SiO_2$ is preferably a molten type. $TiO_2$ may be selected from the group consisting of rutile, anatase and brookite. Considering the dielectric properties, $TiO_2$ is preferably rutile.

The fluorocarbon resin composition of the present invention contains low molecular-weight PTFE micro-powders and inorganic powders. The excellent alignment ability of the short molecular chain of the low molecular-weight PTFE micro-powders is combined with suitable high temperature sintering and high temperature pressing to effectively increase the crystallinity of prepregs and copper foil substrates. The purpose of increasing the crystallinity of the material is to increase the thermal conductivity of the material.

The method for controlling the crystallinity of the low molecular-weight PTFE micro-powders according to the present invention is achieved by controlling and adjusting the cooling rate during the pressing process for preparing the copper foil substrate, and preferably the cooling rate (or crystallization rate) is 1 to 4° C./min When the cooling rate is too fast, the low molecular-weight PTFE micro-powders cannot be arranged and crystallized; however, if the cooling rate is too slow, the process takes too long, which affects the productivity and is not practical.

The fluorocarbon resin prepreg of the present invention is manufactured by impregnation-coating a fiberglass cloth as a substrate with the fluorocarbon resin composition of the present invention for a plurality of times.

In the process for manufacturing the copper foil substrate of the present invention, the fluorocarbon resin prepreg of the present invention is used as a substrate. After a copper foil is bonded to the upper surface and the lower surface, the temperature is lowered from 350° C. to 250° C. during pressing. By controlling the appropriate cooling rate between 1 to 4° C./min, the crystallinity of the fluorocarbon resin composition can be controlled and enhanced, thereby improving the thermal conductivity of the copper foil substrate and manufacturing a high-frequency circuit substrate high a high thermal conductivity coefficient and a wide range of dielectric constant.

The following embodiments and comparative examples are given to illustrate the effects of the present invention, but the scope of the present invention is not limited to the embodiments.

The copper foil substrates manufactured in the respective embodiments and comparative examples were evaluated for physical properties according to the following methods:
1. The cooling rate during the pressing process for the copper foil substrate is controlled by the temperature control system of the hot press, and the controllable adjustment range is between 1 and 20° C./min.

2. Differential Scanning calorimetry (DSC) Test:
The primary thermal enthalpy of the substrate was measured using a differential scanning calorimeter (DSC Q20 from TA Instruments).
3. Heat Conductivity Analysis Test:
According to ASTM-D5470, heat conductivity analysis test was conducted using a heat resistance and thermal conductivity measuring instrument (Taiwan Ruiling Technology Co., Ltd.; Model LW-9389) for interface materials.
4. Dielectric Constant Dk (10 GHz):
The dielectric constant Dk at a frequency of 10 GHz was tested using a Dielectric Analyzer Model HP Agilent E4991A.
5. Dielectric Loss Df (10 GHz):
The dielectric loss Df at a frequency of 10 GHz was tested using a Dielectric Analyzer Model HP Agilent E4991A.

Embodiments 1 to 5, Comparative Examples 1 to 3 a) Preparation of fluorocarbon resin composition prepreg:
According to the formulations and ratios listed in Table 1, the preparation of the fluorocarbon resin composition prepreg is carried out, and the preparation steps are as follows. The PTFE resin emulsion and the fluorine-containing copolymer resin emulsion were uniformly stirred and mixed at a rotation speed of 100 rpm for 20 minutes. Then, low molecular-weight PTFE micro-powders and the inorganic powders were added to the above uniformly mixed emulsion, which is stirred at a rotation speed of 500 rpm for 30 minutes until the low molecular-weight PTFE micro-powders and the inorganic powders were uniformly dispersed and suspended in the emulsion. Finally, the fluorocarbon resin composition prepreg is obtained by uniformly stirring the above uniformly mixed emulsion for 20 minutes.
b) Manufacturing a fluorocarbon resin prepreg:
A fiberglass cloth is impregnated in the fluorocarbon resin composition prepreg prepared above and then the fiberglass cloth impregnated with the prepreg is fed into a furnace for drying (at 80 to 120° C.), baking (at 200 to 240° C.) and sintering (at 340 to 360° C.). All sections of the heating process are maintained for at least 20 minutes for sufficient heating. The impregnation-coating and heating steps were repeated several times until the thickness of the fluorocarbon resin composition layer on the fiberglass cloth was about 100 μm such that a fluorocarbon resin prepreg was obtained.
c) Manufacturing a copper foil substrate:
The fluorocarbon resin composition impregnated body obtained above was pressed against a copper foil at a temperature of 350° C. and a pressure of 50 kg/cm², held at a temperature for 2 hours, cooled down to 250° C., and then cooled down to room temperature at a cooling rate of 10° C./min to obtain a copper foil substrate. More particularly, during the process of pressing, when the temperature was lowered from 350° C. to 250° C., the crystallinity of the PTFE micro-powders in the fluorocarbon resin composition in Embodiments 1 to 5 and Comparative Examples 1 to 3 was different due to cooling rate difference, thereby affecting the thermal conductivity.

The crystallinity, thermal conductivity, and dielectric properties of the substrate were evaluated. The results of each physical property measurement are listed in Table 1.

Results

The crystallinities of the fluorocarbon resin compositions of Embodiments 1 to 3 were adjusted by adding low molecular-weight PTFE micro-powders of different ratios.

When the content of low molecular-weight PTFE increases, the crystallinity of the fluorocarbon resin composition is significantly improved to further enhance the thermal conductivity of the substrate to a maximum of 1.33 W/m·K, while maintaining excellent dielectric properties and heat resistance. The fluorocarbon resin composition of Comparative Example 1 without adding any low-molecular-weight PTFE micro-powders exhibits excellent heat resistance and electrical properties of the substrate after being pressed. However, the thermal conductivity was only 0.61 W/m·K, which indicates that the addition of low molecular-weight PTFE to the fluorocarbon resin composition has an effect of remarkably increasing the thermal conductivity.

dispersion in the substrate. Non-uniform interface leads to high dielectric loss and poor heat resistance, which is likely to cause processing reliability problems in the printed circuit board.

The copper foil substrates of Embodiments 1 to 5 are formed by press-molding using the fluorocarbon resin prepreg prepared above to exhibit excellent thermal conductivity, dielectric properties, and stable processing reliability. Furthermore, the copper foil substrates of Embodiments 1 to 5 can simultaneously realize a wide range of dielectric properties to meet the requirements for heat dissipation and dielectric properties of high-frequency and high-power electronic products.

TABLE 1

Composition of Prepreg Formulations of Embodiments and Comparative Examples and Their Implementation Results

| Composition (wt %) | | Embodiments | | | | | Comparative Examples | | | |
|---|---|---|---|---|---|---|---|---|---|---|
| | | 1 | 2 | 3 | 4 | 5 | 1 | 2 | 3 | 4 |
| Polytetrafluoroethylene resin | PTFE | 55 | 35 | 10 | 55 | 10 | 60 | 35 | 35 | 15 |
| Fluorine-containing copolymer | PFA | 2.5 | 2.5 | 2.5 | 2.5 | 2.5 | 2.5 | 2.5 | 2.5 | 2.5 |
| | FEP | 2.5 | 2.5 | 2.5 | 2.5 | 2.5 | 2.5 | 2.5 | 2.5 | 2.5 |
| Low molecular-weight PTFE micro-powders | | 5 | 25 | 50 | 25 | 5 | — | 25 | 25 | — |
| Inorganic powders | $TiO_2$ | — | — | — | — | 80 | — | — | — | — |
| | $Al_2O_3$ | 5 | 5 | 5 | — | — | 5 | 5 | 5 | — |
| | BN | 30 | 30 | 30 | 15 | — | 30 | 30 | 30 | 80 |
| Thickness (μm) | | 106 | 102 | 100 | 105 | 107 | 105 | 104 | 103 | 99 |
| Cooling rate (° C./min) from 350° C. to 250° C. | | 1.0 | 1.0 | 1.0 | 4.0 | 4.0 | 1.0 | 5.0 | 0.5 | 1.0 |
| Cooling time (min) | | 100 | 100 | 100 | 25 | 25 | 100 | 20 | 200 | 100 |
| Crystallinity (%) | | 70.1 | 74.5 | 78.2 | 73.9 | 69.5 | 61.9 | 65.0 | 74.9 | 60.8 |
| ½ hr PCT heat resistance | | >600 sec | >600 sec | >600 sec | >600 sec | 362 sec | >600 sec | >600 sec | >600 sec | poor |
| Thermal conductivity (W/m · K) | | 1.02 | 1.15 | 1.33 | 0.92 | 1.05 | 0.61 | 0.79 | 1.16 | 1.83 |
| Dk (10 GHz) | | 3.03 | 3.09 | 3.11 | 2.51 | 12.5 | 3.05 | 3.09 | 3.05 | 3.51 |
| Df (10 GHz) | | 0.0020 | 0.0021 | 0.0022 | 0.0013 | 0.0028 | 0.0021 | 0.0021 | 0.0022 | 0.0039 |

In the fluorocarbon resin compositions of Embodiments 4 and 5, by adjusting the types of the inorganic powders and the ratio of the inorganic powders in PTFE, the cooling rate was increased to 4.0° C./min, while maintaining excellent crystallinity and thermal conductivity. The dielectric constant Dk of the substrate can be adjusted between 2.5 and 12.5. The wider dielectric constant range is beneficial to the circuit design of different printed circuit boards. The low dielectric constant can be used for high-speed transmission applications. The high dielectric constant can miniaturize the circuitry to reduce the size of the overall electronic components.

Compared with Embodiment 2, in Comparative Example 2, the cooling rate of the pressed substrate is lowered from 1.0° C./min to 5.0° C./min and the thermal conductivity of the substrate decreases from 1.15 W/m·K to 0.79 W/m·K, indicating the influence of the molecular arrangement of the low molecular-weight PTFE micro-powders on the crystallinity and the thermal conductivity. In Comparative Example 3, the cooling rate of was reduced to 0.5° C./min, which was not significant for improving crystallinity and thermal conductivity, and was time-consuming and energy-consuming to significantly increase the processing cost.

In Comparative Example 4, a large amount of inorganic powders were added without adding low molecular-weight PTFE micro-powders. Although the thermal conductivity effectively increased to 1.83 W/m·K after pressing, the large amount of inorganic powders causes poor inorganic powders

What is claimed is:

1. A copper foil substrate, prepared by pressing a fluorocarbon resin prepreg as a substrate against a copper foil attached on the upper surface and a copper foil attached on the lower surface thereof at a temperature of 350° C. and a pressure of 50 kg/cm² and then cooling down the fluorocarbon resin prepreg to room temperature through a first cooling process and a second cooling process, wherein in the first cooling process, the fluorocarbon resin prepreg is cooled down from 350° C. to 250° C. at a cooling rate of 1 to 4° C./min, and in the second cooling process, the fluorocarbon resin prepreg is cooled down from 250° C. to room temperature at a cooling rate of 10° C./min, wherein the fluorocarbon resin prepreg is prepared by impregnation-coating a fiberglass cloth as a substrate with a fluorocarbon resin composition, wherein after the fiberglass cloth is impregnated in the fluorocarbon resin composition prepreg, the fiberglass cloth impregnated with the prepreg is fed into a furnace for drying at 80 to 120° C., baking at 200 to 240° C. and sintering at 340 to 360° C., and wherein a crystallinity of the fluorocarbon resin composition is within a range of 69.5% to 78.2%, and a dielectric loss of the copper foil substrate at a frequency of 10 GHz is within a range of 0.0013 to 0.0028, wherein the fluorocarbon resin composition includes, on the basis of the total weight of the fluorocarbon resin composition being 100 wt %:

(1) a polytetrafluoroethylene (PTFE) resin, accounting for 10 to 90 wt %;
(2) a fluorine-containing copolymer, accounting for 1 to 10 wt % and selected from the group consisting of one or a combination of more of poly fluoroalkoxy (PFA) and fluorinated ethylene propylene (FEP);
(3) low molecular-weight PTFE micro-powders, accounting, for 5 to 50 wt %, the molecular weight of the low molecular-weight PTFE micro-powders being 2000 to 200000, wherein an average particle diameter of the low molecular-weight PTFE micro-powders is 1 to 10 μm; and
(4) inorganic powders, accounting for 15 to 80 wt %, wherein an average particle diameter of the inorganic powders is 0.01 to 50 μm, and wherein the inorganic powders is one ore more selected from the group consisting of silicon dioxide ($SiO_2$), titanium dioxide ($TiO_2$), aluminum hydroxide ($Al(OH)_3$), alumina ($Al_2O_3$), magnesium hydroxide ($Mg(OH)_2$), magnesium oxide (MgO), calcium carbonate ($CaCO_3$), boron oxide ($B_2O_3$), calcium oxide (CaO), strontium titanate ($SrTiO_3$), barium titanate ($BaTiO_3$), calcium titanate ($CaTiO_3$), magnesium titanate ($2MgO.TiO_2$), boron nitride (BN), aluminum nitride (AlN), silicon carbide (SiC), cerium oxide ($CeO_2$) and fume silica.

* * * * *